US 8,400,138 B2

(12) United States Patent
Cooper et al.

(10) Patent No.: US 8,400,138 B2
(45) Date of Patent: Mar. 19, 2013

(54) METHOD AND APPARATUS FOR MEASURING CURRENT OUTPUT OF LOW-VOLTAGE PAD-MOUNT DISTRIBUTION POWER TRANSFORMERS

(75) Inventors: David Michael Cooper, Raleigh, NC (US); Thomas Taylor Stewart, Coupeville, WA (US); Gary Lee Hielkema, Lynden, WA (US)

(73) Assignee: Elster Solutions, LLC, Raleigh, NC (US)

( * ) Notice: Subject to any disclaimer, the term of this patent is extended or adjusted under 35 U.S.C. 154(b) by 500 days.

(21) Appl. No.: 12/696,319

(22) Filed: Jan. 29, 2010

(65) Prior Publication Data
US 2010/0194380 A1 Aug. 5, 2010

Related U.S. Application Data

(60) Provisional application No. 61/148,698, filed on Jan. 30, 2009.

(51) Int. Cl.
*G01R 15/18* (2006.01)
(52) U.S. Cl. ...................... 324/117 R; 324/142; 324/547
(58) Field of Classification Search .............. 324/117 R, 324/117 H, 126, 142, 547, 74; 361/666; 336/178
See application file for complete search history.

(56) References Cited

U.S. PATENT DOCUMENTS

| 4,748,405 | A | * | 5/1988 | Brodzik et al. | ................ 324/127 |
| 4,791,361 | A | * | 12/1988 | Beihoff et al. | ................ 324/126 |
| 4,983,932 | A | * | 1/1991 | Kitagawa | ........................ 333/12 |
| 5,057,659 | A | | 10/1991 | Schneider et al. | |
| 5,057,769 | A | | 10/1991 | Edwards | |
| 5,446,435 | A | * | 8/1995 | Etter | .............................. 336/178 |
| 7,230,413 | B2 | * | 6/2007 | Zhang et al. | .............. 324/117 R |
| 7,312,686 | B2 | * | 12/2007 | Bruno | ............................ 336/229 |
| 7,321,227 | B2 | * | 1/2008 | Fritsch et al. | ................. 324/142 |
| 7,557,563 | B2 | * | 7/2009 | Gunn et al. | .................... 324/127 |

OTHER PUBLICATIONS

ERMCO, "Single Phase Pad Mounted Distribution Transformer," Sep. 2001, 4 pages.
"Products," www.kinectsolutions.com/products.php, © 2009 accessed Jan. 18, 2010, 3 pages.

* cited by examiner

*Primary Examiner* — Arleen M Vazquez
(74) *Attorney, Agent, or Firm* — Woodcock Washburn LLP

(57) ABSTRACT

A current sensing assembly is provided for sensing the current travelling through a current carrying member of a pad mount distribution transformer in a meter network. A current sensor includes a slot having an open end that receives the current carrying member. The sensor includes a conductive coil disposed adjacent the slot that generates an output signal indicating a sensed current level. A retainer member includes a retainer wall that is configured to be inserted into the open end of the slot so as to define a receptacle that captures the current carrying member therein.

18 Claims, 4 Drawing Sheets

METHOD AND APPARATUS FOR MEASURING CURRENT OUTPUT OF LOW-VOLTAGE PAD-MOUNT DISTRIBUTION POWER TRANSFORMERS

CROSS-REFERENCE TO RELATED APPLICATIONS

This claims priority to U.S. Provisional Patent Application Ser. No. 61/148,698, filed Jan. 30, 2009, the disclosure of which is hereby incorporated by reference as if set forth in its entirety herein.

FIELD

The present disclosure relates to current flow measurement through transformers, an in particular relates to a method and apparatus for installing a current sensor in a transformer.

BACKGROUND

Referring to FIGS. 1A-B, a conventional low-voltage pad-mount distribution transformer 20 in a meter network. The transformer 20 includes a housing 21 that defines a wire-retaining void 23 configured to retain the terminal ends 25 of a plurality of output load wires 27. Typically, the load wires 27 are buried in the ground 31, and the terminal ends 25 extend up through the ground and into an open base 29 in the housing 21 that leads to the internal void 23. The transformer 20 is illustrated as a single-phase power distribution transformer, though it should be appreciated that the transformer could alternatively be provided as a polyphase transformer having, for instance, three phases. The housing 21 further includes a cover 33 that can be removed or opened so as to selectively provide access to the void 23 and the contained electrical components.

The transformer 20 includes a plurality of output terminal assemblies 32 mounted onto an inner wall of the housing 21. Each output terminal assembly 32 includes an electrically insulating bushing mounting flange 35, an electrically insulating bushing 22, an electrically conductive output stud 28, and an electrically conductive wiring terminal 30 that receives a plurality of the output load wires 27. It should be appreciated that the flange 35 can be integrally connected to the bushing 22, or can be discretely connected to the bushing 22. It should further be appreciated that the electrically conductive components of the terminal assemblies 32 are current carrying conductors, and thus also current carrying members. Furthermore, the insulative components of the terminal assemblies 32 that carry a conductor (such as the bushing 22) while not conductive themselves, are current carrying members that carry the current of the current carrying conductors.

In accordance with the illustrated embodiment, the panel mount 35 can be bolted onto, or otherwise attached to or supported by the housing 21. The insulated bushing 22 can be cylindrical or alternatively shaped, and projects out from the panel mount 35 into the wire-retaining void 23. The electrically conductive output stud 28 defines a proximal end extending through the bushing 22 and panel mount 35, and connects to a high voltage source. The output stud 28 further defines a distal end opposite the proximal end that extends into the conductive wiring terminal 30. An exposed portion 41 of the output shaft 28 thus extends through a gap 38 disposed between the bushing 22 and the wiring terminal 30.

The wiring terminal 30 includes a plurality of output stud locks 34 that can include a set screw 39 or other suitable structure sufficient to retain the output stud 28 in the terminal 30 and provide a secure electrical connection between the wiring terminal 30 and the output stud 28. The wiring terminal 30 further includes a plurality of wire mounting apertures 36 that receive the terminal ends 25 of the wires 27. The wiring terminal 30 further includes a plurality of clamps 37 that can include a set screw or other suitable structure sufficient to retain the terminal ends 25 in the wire mounting apertures 36, thereby providing a secure electrical connection between the wires 27 and the wiring terminal 30. Accordingly, the output stud 28 is placed in electrical communication with the output load wires 27, which provide electrical power to a plurality of local nodes. It is appreciated that the output terminal assembly 32 is illustrated in accordance with one embodiment, and that numerous alternative configurations are known. The embodiments described herein are intended to be used in combination with all such alternative embodiments.

It is desirable to measure the electrical power flowing through each output terminal assembly 32, for instance to reconcile the power usage as measured at the nodes with the power applied at the transformer. Because the output stud 28 carries high currents, for instance on the order of approximately 100 Amps of alternating current, it is recognized that it is desirable to provide high reliable contact and low resistance at the interface between the output stud 28 and the wiring terminal 30. As a result, the output stud 28 projects as deep into the wiring terminal 30, which minimizes the gap 38 and corresponding exposed portion 41 of the output shaft 28. For instance, the gap 38, and corresponding exposed portion 41, can be as small as 0.5 inch. Furthermore, the output stud 28 has a diameter or cross-sectional dimension less than that of the bushing 22 and wiring terminal 30. Accordingly, access to the exposed portion 41 of the output stud 28 is limited.

What desirable is a method and apparatus for sensing current of a terminal assembly of a pad-mount distribution transformer.

SUMMARY

A current sensing assembly is configured to sense a current carrying member of a pad-mount distribution transformer. The current sensor assembly includes a current sensor and a retainer member. The current sensor includes a sensor body that carries a conductive coil and a first engagement member. The current sensor defines a slot that extends into the body. The slot defines an open end configured to receive the current carrying member. The retainer member includes a retainer wall carrying a second engagement member configured to engage the first engagement member when the retainer member is inserted into the slot. The retainer member further includes an actuator configured to bias the second engagement member into and out of engagement with the first engagement member. The retainer wall at least partially closes the open end of the slot when the retainer is inserted into the slot so as to at least partially define a receptacle that secures the conductor therein.

BRIEF DESCRIPTION OF THE DRAWINGS

The foregoing summary, as well as the following detailed description of example embodiments, are better understood when read in conjunction with the appended diagrammatic drawings. For the purpose of illustrating the invention, the drawings show embodiments that are presently preferred. The invention is not limited, however, to the specific instrumentalities disclosed in the drawings.

DETAILED DESCRIPTION

Figure 1A:
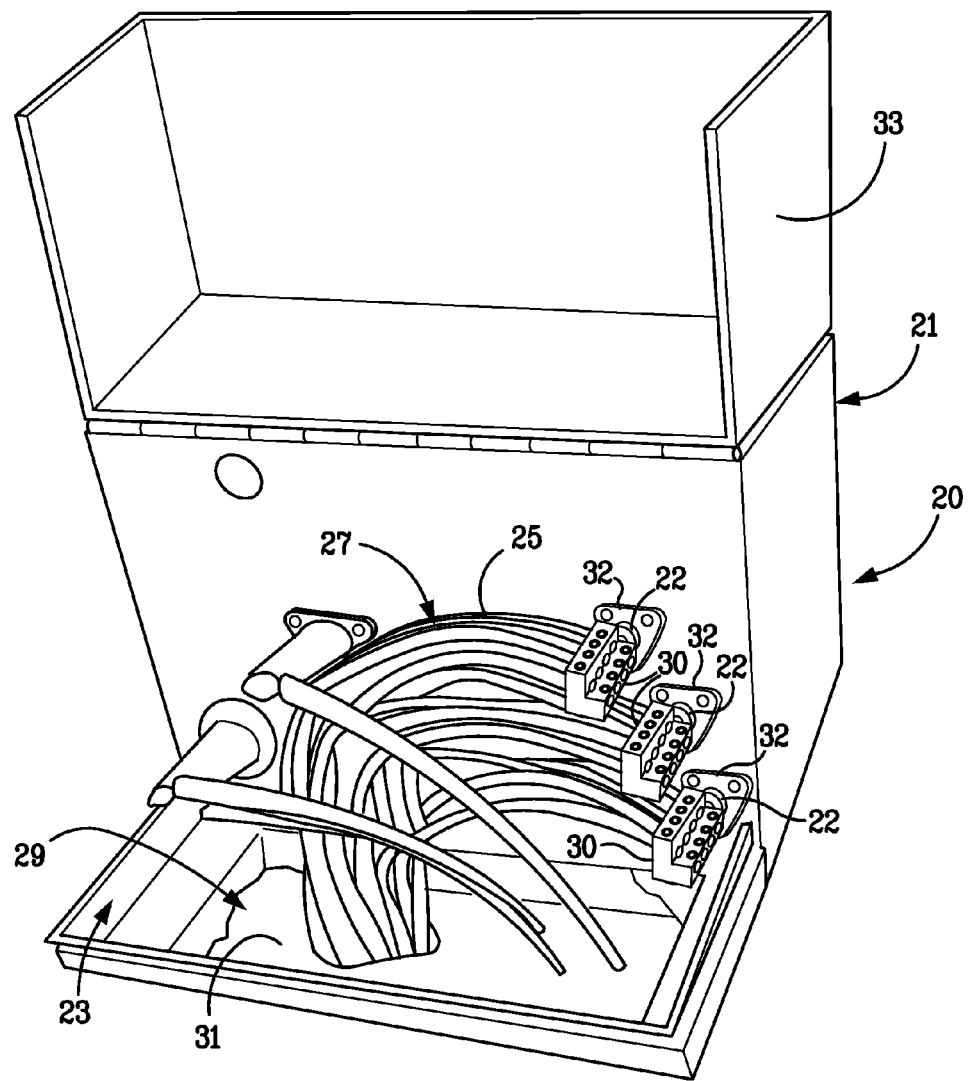
FIG. 1A is a perspective view of a conventional low-voltage pad mount distribution transformer.
Figure 1B:
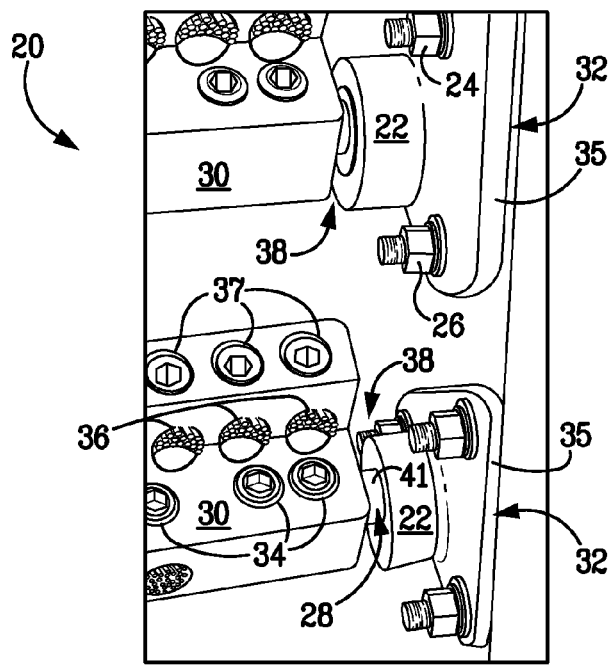
FIG. 1B is a perspective view of an output terminal assembly of the conventional low-voltage pad-mount distribution transformer illustrated in FIG. 1A.
Figure 2A:
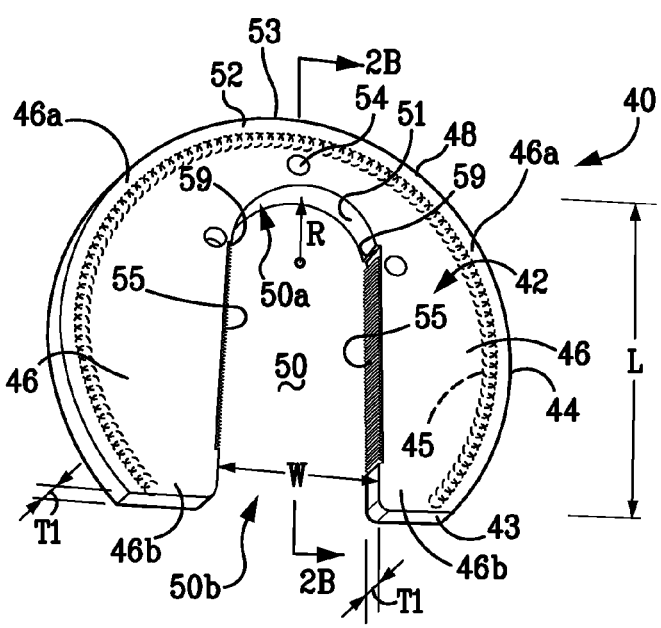
FIG. 2A is a perspective view of an open-aperture current sensor constructed in accordance with one embodiment.
Figure 2B:
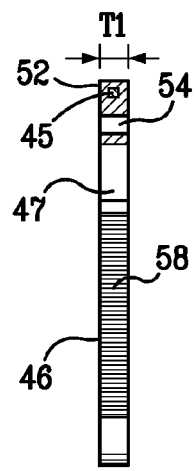
FIG. 2B is a sectional side elevation view of the sensor illustrated in FIG. 2A, taken along line 2B-2B.
Figure 3:
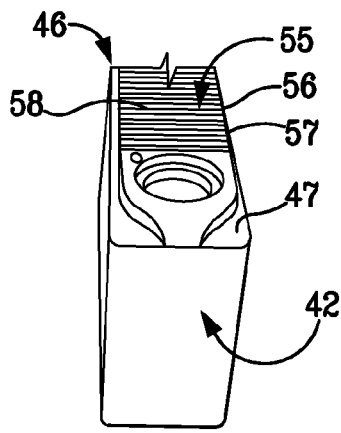
FIG. 3 is a perspective view of a portion of the current sensor illustrated in FIGS. 2A-B, showing an engagement member.

Referring to FIGS. 2A-B and 3, an open-aperture AC current sensor 40 is provided as a Rogowski-based current sensor. Accordingly, the current sensor 40 includes an arc-shaped or C-shaped substantially planar insulating body 42. The insulating body 42 can be formed from any suitable electrically insulative material, such as plastic. The insulating body 42 defines a pair of opposing planar surfaces 43 and 44, and a thickness T1 between the outer surfaces of less than approximately 0.5 inch. The body 42 defines an outer surface 48 that extends in an arc, for instance greater than 180°, such as approximately 270°. It should however be appreciated that the outer surface 48 can define any suitable alternative shape as desired.

The body 42 further defines a pair of arms 46 defining corresponding proximal ends 46a, and a bridge 52 that is connected between proximal ends 46a of the arms 46. Each arm 46 further defines a distal terminal end 46b disposed opposite the proximal end 46a. It should thus be appreciated that various structure of the sensor 40 is described herein as extending in a proximal or a distal direction, and that these directions are used with reference to the proximal 46a and distal 46b ends of the arms 46.

Each arm 46 defines an inner surface 47, and a corresponding opposing outer surface 49. Likewise, the bridge 52 defines an inner surface 51 and a corresponding outer surface 53. The outer surfaces 49 and 53, in combination, define the outer surface 48 of the body 42. The inner surfaces 47 of the arms 46 extend substantially parallel to each other in accordance with the illustrated embodiment, though the inner surfaces 47 can define any suitable shape as desired. The inner surface 51 of the bridge 52 is connected between the proximal ends of the inner surfaces 47, and is illustrated as curved defining radius of curvature R. It should be appreciated, however, that the inner surface 51 can define any alternative shape as desired suitable to join the proximal ends 46a of the arms 46 at their inner surfaces 47.

The current sensor 40 further includes a slot 50 extending into the insulating body 42. The slot 50 is defined by the inner surface 51 of the bridge 52 and the opposing inner surfaces 47 of each arm 46 of the body 42. The inner surfaces 47 are spaced apart a distance that defines a width W of the slot 50. The slot 50 defines a proximal end 50a defined by the inner surface 51, an opposing open distal end 50b, such that the distal ends 46b of each arm 46 are separated by the distal end 50b of the slot 50. The slot 50 defines a length L disposed between the proximal end distal ends 50a-b.

In this regard, it should be appreciated that the width W and length L of the slot 50 are suitable such that the slot 50 at least partially defines a receptacle 87 or mounting space (see FIG. 5) configured to receive an electrical current carrying member. For instance, it should be appreciated that the slot 50 can directly receive the conductor, or can alternatively receive an insulating body that contains the conductor. The distal terminal ends 46b define a leading end of the current sensor 40 when the sensor 40 is mounted onto the electrical component, such that the electrical component is received between the opposing arms 46 in the slot 50. For instance, the slot 50 is configured to receive a conductor stud, such as the conductive output stud 28 as described above. Furthermore, width W and length L of the slot 50 can be dimensioned so as to receive the insulating bushing 22 that contains the conductive output stud 28. The slot 50 can further be dimensioned to receive certain conventional wiring terminals that electrically connect output load wires such as the output load wires 27 described above to a conductor stud, such as the conductor stud 28 as described above. The current sensor 40 can define at least one aperture 54 extending through the insulating body 42, which can receive clamps or other engagement structure suitable to mount the sensor 40 to a support structure as desired.

The current sensor 40 includes an electrically conductive coil 45 that is embedded in the insulating body 42, such that the coil 45 is contained between the planar surfaces 43 and 44. Thus, the coil 45 has a non-magnetic low inductance core, as opposed to a conventional iron core. The coil 45 generally follows the outer periphery of the sensor body 42. When the slot 50 receives the electrical conductor whose current is to be measured, a voltage is induced in the conductive coil 45 that is proportional to the rate of magnetic flux change around the received conductor. The magnetic flux is, in turn, is proportional to the instantaneous current flowing through the conductor. It should be appreciated that the output of the conductive coil is integrated so that the voltage output is directly proportional to the current of the conductor. Accordingly, as described below with respect to FIG. 6, the current sensor 40 can provide an output voltage signal that is indicative of the current flowing through the conductor disposed in the slot 50. The output voltage signal from the sensor 40 of each terminal assembly can be received by an electronic measuring device 102 that calculates the power of the transformer 20, and thus also can calculate total energy consumed by a transformer load. The current sensor 40 thus operates under the general principles of a Rogowski coil, which completely surrounds the electrical conductor whose current flow is to be measured. Accordingly, the coil 45 can be referred to as a modified Rogowski coil that does not completely surround the received electrical conductor, but rather has an open terminal end that receives the conductor whose current is to be measured. Modified Rogowski coils are known in the art, for instance as described in U.S. Pat. No. 5,057,769.

Referring also to FIG. 3, the current sensor body 42 carries a first engagement member 55 that is configured to engage a complementary engagement member of a retainer member 60 (see FIG. 4), for instance when mounting the current sensor onto the electrical conductor. In accordance with the illustrated embodiment, the engagement member 55 is provided as a rack 56 of projections that define one or more teeth 58. The rack 56 extends along a direction between the proximal and distal ends 46a-b of a corresponding one of the inner surfaces 47. As illustrated, a rack 56 extends along both inner surfaces 47 in a direction parallel to the planar surfaces 43 and 44. Each rack 56 includes a plurality of teeth 58 that project into the slot 50 from the inner surfaces 47, and are elongate along a direction between the planar surfaces 43 and 44. Each rack 56 further defines a plurality of interstices 57 disposed between adjacent teeth 58. In accordance with the illustrated embodiment, the teeth 58 are oriented substantially normal to the planar surfaces 43 and 44. It should be appreciated that the racks 56 and corresponding teeth 58 can be oriented and shaped as desired.

The current sensor body 42 further includes a stop protrusion 59 extending into the slot 50 from the inner surfaces 47 at a location adjacent and proximal to the proximal end of the corresponding rack 56. The stop protrusion 59 extends into the slot 50 a distance greater than the teeth 58. As a result, the retainer 60 can be sized for insertion into the slot 50 along a proximal direction so as to pass between the racks 56 and abut the stop protrusions 59, thereby limiting the insertion of the retainer 60 into the slot 50 as will now be described.

Figure 4:
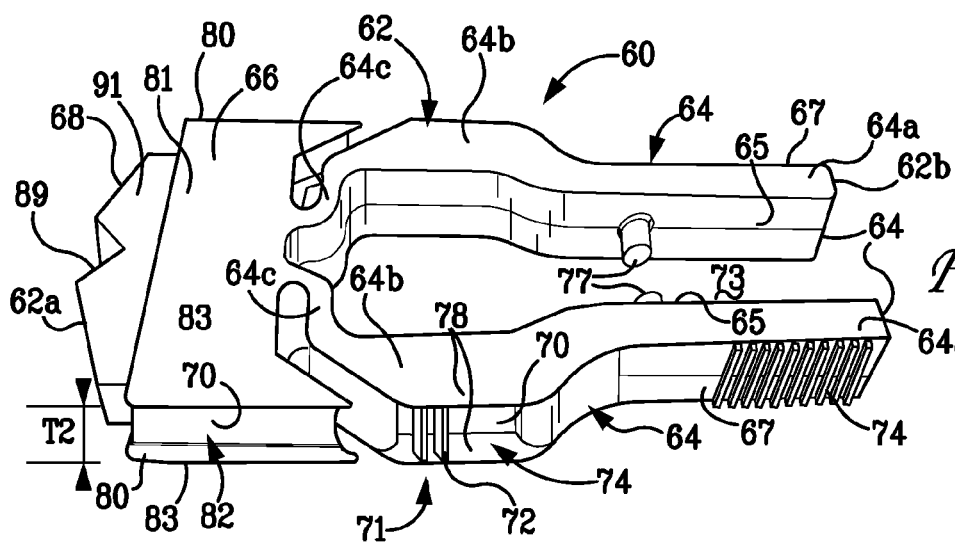
FIG. 4 is a perspective view of a retaining member including an engagement member configured to mate with the engagement member of the current sensor illustrated in FIGS. 2A-B.
Figure 5:
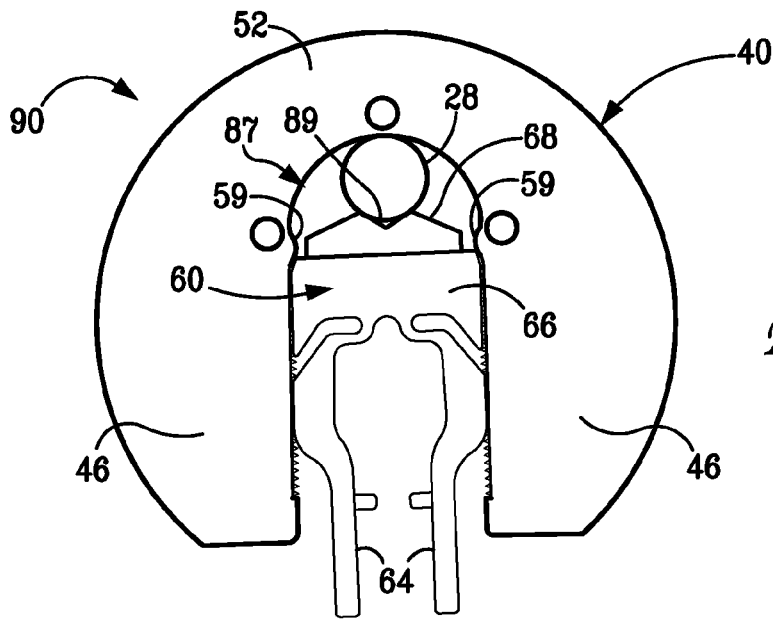
FIG. 5 is a perspective view of the retaining member illustrated in FIG. 4 mated with the current sensor illustrated in FIG. 4.

In particular, referring now to FIGS. 4-5, the retainer member 60 includes a retainer body 62 defining a proximal end 62a and an opposing distal end 62b. The retainer member body 62 can have a thickness T2 that is less than the size of the gap 38 disposed between the bushing 22 and the wiring terminal 30, such as approximately 0.5 inches. The body 62 can be formed from any suitable electrically insulative material, such as plastic. As will be appreciated, the proximal end 62a defines an insertion end configured to be inserted into the slot 50 of the current sensor 40 and cooperate with the sensor body 42 to retain current carrying member, such as a conductor, in the slot 50, and the distal end 62b defines a handle end of the retainer member 60 configured to be manipulated by a user. It should be appreciated that various structure of the retainer member 60 is described herein as extending in a proximal or a distal direction as indicated by the proximal and distal ends of the body 62.

The retainer body 62 includes a pair of opposing arms 64 configured to manipulate the retainer member, a retainer wall 66 extending proximally from the arms 64 and configured to engage the arms 46 of the current sensor, and a pad 68 extending proximally from the retainer wall 66 and configured to cooperate with the current sensor body 42 to retain the conductor in the slot 50. The pad 68 can cooperate with the sensor body 42 to define a receptacle 87 that retains a current carrying member whose current is to be sensed by the current sensor 40.

Each arm 64 defines an inner surface 65 and an opposing outer surface 67. The inner surfaces 65 of the opposing arms 64 are separated by a gap 73. Each arm 64 defines a distal region 64a that carries a textured grip 74, an outwardly flared central region 64b that carries a second engagement member 71 configured to mate with the engagement member 55 of the current sensor 40, and an inwardly extending proximal region 64c that is connected to the retainer wall 66. The proximal regions 64c provide hinges that have a reduced thickness with respect to the central region 64b, such that the central 64b and distal 64a regions of each arm 64 can flex about the corresponding proximal region 64c.

The grip 74 projects outward from the outer surface 65 of the distal region 64a of each arm 64, and is configured to be engaged by a user to allow easy manipulation of the arms 64 and the retainer 60. Each arm 64 further includes a stop member in the form of a pin 77 that projects inwardly from the inner surface 65 of the proximal region 64c. When the arms 64 are in a first or neutral relaxed configuration, the terminal ends of the stop pins 77 are spaced apart, and configured to abut each other when the arms 64 are flexed inwardly toward each other a predetermined distance, so as to limit the inward deflection of the arms 64.

The retainer member 60 further includes an engagement member 71 including at least one or a plurality of teeth 72 carried by the outer surface 67 of the central region 64b. The teeth 72 are configured to mate and interlock with the one or more teeth 58 extending from the inner surface 47. In particular, the central region 64b of each arm 64 includes a guide 70 defined by a pair of spaced walls 78 defining a channel 79 therebetween. The channel 79 is sized to receive the rack 56. The teeth 72 are disposed in the channel 79, and can be angled distally along a direction from the inner surface 65 of the arm 64 to the outer surface 67. Accordingly, the one or more teeth 72 are configured to cam over the complementary one or more teeth 58 of the current sensor 40 when the retainer member 60 is inserted in the slot 50, and engage the teeth 58 with respect to inadvertent removal of the retainer member 60 from the slot 50.

While the current sensor 40 and retainer member 60 are illustrated and described herein as including engagement members 55 and 71 in the form of mating teeth 58 and 72, it should be appreciated that the current sensor 40 and retainer member 60 could include any suitable alternatively engagement structure located anywhere on the respective bodies 42 and 62 such that the retainer member 60 is configured to reliably connect to the current sensor 40 so as to engage a conductor in the manner described herein.

The retainer wall 66 is connected to and carries the arms 64. In particular, the retainer wall 66 extends proximally from the proximal regions 64c of the arms 64, and defines a retainer wall body 81 presenting a pair of opposing outer surfaces 80. The retainer wall 66 defines a channel 82 projecting into each outer surface 80, so as to define a pair of spaced walls 83 sized to receive the rack 56 therebetween. If the rack 56 extends between the opposing planar surfaces 43 and 44, then the channels 82 can receive the arms 46 therein. The channel 82 has a depth that is greater than the distance that the teeth 58 project into the slot 50, such that the channel 82 can slidably receive the rack 56. Because the channels 82 are aligned with the channel 79 of the arms 64, the channels 82 provide a guide that aligns the teeth 72 of the retainer member 60 with the teeth 58 of the current sensor 40.

The pad 68 extends proximally from the proximal end of the retainer wall 66, and can be made from any suitable insulative material. As illustrated, the pad 68 is compliant, and made from rubber or any suitable alternative material. The pad 68 includes a pad body 91 that is inwardly recessed with respect to the outer surfaces 80 of the retainer wall 66. The pad body 68 is dimensioned to fit inside the slot 50 while avoiding interference with the inner surfaces 47 and 51, and the stop protrusions 59. The pad body 91 defines a conductor-engaging proximal end 84 that defines an engagement surface 85 configured to engage the conductive member whose current is to be measured. The pad 68 defines a notch 89, which can be v-shaped as illustrated, projecting centrally into the engagement surface 85. The notch 89, in combination with the bridge 53, is configured to at least capture the current carrying member of the transformer 20 in the slot 50.

A current sensing assembly 90 thus includes the current sensor 40 and the retainer member 60 that can be joined to the current sensor 40 so as to measure the current flowing through a conductor retained in the current sensing assembly. In particular, during operation, the sensor body 42 is placed over the conductor whose current is to be measured, such as the output stud 28 or bushing 22, such that the conductor is disposed in the slot 50 having an open distal end 50b. Next, the retainer wall 66 of the retainer member 60 is aligned with the slot 50, such that the channel 82 is aligned to receive the racks 56 and/or the arms 46.

The channel 82 is then translated proximally along the inner surfaces 47, thereby causing the retainer wall to at least partially close the distal end 50b of the slot so as to at least partially define a receptacle 87 in combination with the current sensor 40. It should be appreciated that the retainer wall need not entirely close the distal end 50b of the slot, and that one or more openings may still exist in the distal end 50b, or at other locations in the slot. Accordingly, the retainer wall closes the distal end 50b sufficient such that the current carrying member is retained in the receptacle 87 by the retainer and the current sensor 40. An inwardly biasing force can be applied to the arms 64 of the retainer member 60 that causes the arms 64 to deflect in a first direction, such as inwardly toward each other, from the first relaxed configuration to a second compressed or unlocked configuration, whereby the opposing teeth 72 are disposed inward with respect to the teeth 52. The retaining member 60 is then further translated into the slot 50 until the pad 68 body abuts the conductive member, illustrated as the output stud 28 in FIG. 5, thereby retaining the output stud 28 in a receptacle 87 disposed between the engagement surface 85 of the pad 68 and the inner surface 51 of the bridge 52.

Once the conductor 28 is secured in the receptacle 87, the applied biasing force can then be removed. The proximal regions 64c of the arms apply a spring force to the central and distal regions 64b and 64a, thereby causing central portions 64 of each arm 64 to deflect in a second direction opposite the first direction (e.g., outwardly away from each other) to a third locked configuration, whereby the teeth 72 are releasably locked in the interstices 57 between the teeth 52, thereby releasably locking the engagement members 55 and 71. Once the current sensing assembly 90 is mounted onto the conductor 28 and thus configured for long-term current sensing, the cover 33 can be closed for normal meter operation.

When it is desired to remove the current sensing assembly 90 from the conductor 28, the inwardly biasing force is applied to the arms 64, thereby causing the arms to flex and deflect from their third locked position to their second unlocked position, which causes the engagement members 55 and 71 to disengage, thereby allowing the retainer member 60 to translate distally out of the slot 50. The current sensor 40 can then be removed from the conductor 28. In this regard, it should be appreciated that the arms 64 provide an actuator that causes the locking member 71 to engage and disengage the locking member 55. While the arms 64 are constructed to provide a biasing spring force as illustrated, the retainer member 60 could alternatively or additionally include one or more discrete biasing members, such as a spring member, that can bias the arms 64 into their locked positions in the manner described above.

Figure 6:
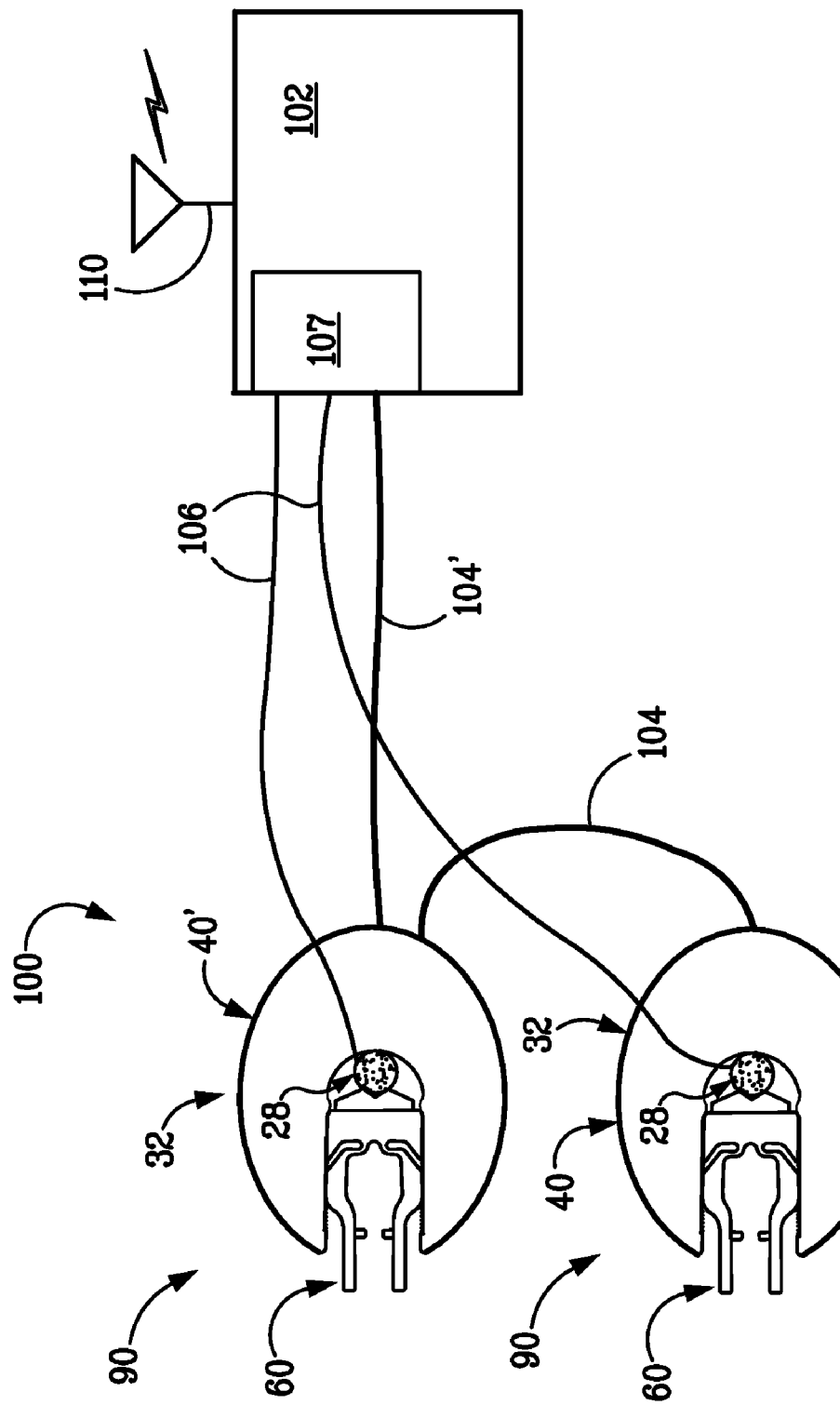
FIG. 6 is a schematic view of a power measurement assembly constructed in accordance with one embodiment.

Referring now to FIG. 6, a power measurement assembly 100 includes a electronic measuring device 102 configured to receive signal of a master current sensor 40' and a slave current sensor 40, each constructed as described above. It is appreciated in the art that the power output of a single phase power distribution transformer 20 can be measured using the difference of two line currents and a line to line voltage. Alternatively, it should be appreciated that the electronic measuring device 102 could alternatively be electrically connected to the phase outputs of a polyphase distribution transformer.

In accordance with the illustrated embodiment, the current sensing assembly 90 can be mounted onto a conductor of each of the two line current terminal assemblies 32, so that each sensor 40 generates a voltage proportional to its line current as described above. The difference of the signals of the sensors 40 is indicative of the total output current flowing through the transformer 20. The power measurement assembly 100 can include a first conductive output lead 104 that is electrically connected from the slave current sensor 40 at one end, to the master current sensor 40' at its opposing end. The master current sensor 40 integrates the difference of the voltage signal generated by the slave current sensor 40 and the voltage signal generated by the master current sensor 40'. The power measurement assembly 100 can include a second conductive output lead 140' that is electrically connected from the master current sensor 40' to the electronic measuring device 102 at its opposing end. The second conductive output lead 104' thus transmits a voltage signal proportional to the difference of the two terminal currents. The power measurement assembly 100 further includes voltage leads 106 that can each be electrically connected to one of the terminal assemblies 32 at one end, and to the electronic measuring device 102 at their opposing end. The voltage leads 106 provide the line voltage of the corresponding terminal assembly 32 to the electronic measuring device 102. The electronic measuring device 102 includes a power measurement circuit 107 that receives the line voltages from the leads 106, along with the electronic signals from the conductive output lead 104', and can thus calculate the power output of the transformer. The electronic measuring device 102 can further include a radio transmitter 110 to wirelessly communicate the resulting energy measurement date to a data collection system.

The foregoing description is provided for the purpose of explanation and is not to be construed as limiting the invention. While the invention has been described with reference to preferred embodiments or preferred methods, it is understood that the words which have been used herein are words of description and illustration, rather than words of limitation. Furthermore, although the invention has been described herein with reference to particular structure, methods, and embodiments, the invention is not intended to be limited to the particulars disclosed herein, as the invention extends to all structures, methods and uses that are within the scope of the appended claims. Those skilled in the relevant art, having the benefit of the teachings of this specification, may effect numerous modifications to the invention as described herein, and changes may be made without departing from the scope and spirit of the invention as defined by the appended claims.

What is claimed:

1. A current sensing assembly configured to sense a current carrying member of a pad-mount distribution transformer, the current sensor assembly comprising:

a current sensor including a sensor body that carries a conductive coil and a first engagement member, the current sensor defining a slot that extends into the body, the slot defining an open end configured to receive the current carrying member; and a retainer member including a retainer wall carrying a second engagement member configured to engage the first engagement member when the retainer member is inserted into the slot, the retainer member further including an actuator configured to bias the second engagement member into and out of engagement with the first engagement member, wherein the retainer wall at least partially closes the open end of the slot when the retainer is inserted into the slot so as to at least partially define a receptacle that secures the conductor therein.

2. The current sensing assembly as recited in claim 1, wherein the sensor body defines a pair of arms and a bridge connected between the arms, and the arms and bridge each defining an inner surface that defines the slot, and the first engagement member is carried by the inner surface of at least one of the arms.

3. The current sensing assembly as recited in claim 2, wherein the first engagement member is carried by the inner surface of both arms.

4. The current sensing assembly as recited in claim 3, wherein the first engagement member comprises at least one tooth, and the second engagement member comprises at least one tooth that engages the at least one tooth of the first engagement member.

5. The current sensing assembly as recited in claim 3, wherein the retainer member further comprises a pair of flexible arms extending from the retainer wall, wherein each flexible arm carries the second engagement member, and the flexible arms are configured to deflect in one direction so as to lock the first and second engagement members, and in an opposing direction to unlock the first and second engagement members.

6. The current sensing assembly as recited in claim 5, wherein the first engagement member comprises at least one tooth, and the second engagement member comprises at least one tooth that engages the at least one tooth of the first engagement member.

7. The current sensing assembly as recited in claim 5, wherein the arms further comprise an inwardly extending stop configured to limit inward deflection of the arms toward each other.

8. The current sensing assembly as recited in claim 2, wherein the retainer member further comprises a pad projecting out from the retainer wall, wherein the pad and the bridge are configured to capture the current carrying member therebetween.

9. The current sensing assembly as recited in claim 8, wherein the pad comprises a notch to at least partially capture the current carrying member.

10. The current sensing assembly as recited in claim 8, wherein the pad is compliant.

11. The current sensing assembly as recited in claim 1, wherein the retainer wall comprises a guide that is aligned with the second engagement member, and the guide is configured to receive the first engagement member when the retainer wall is inserted into the slot.

12. The current sensing assembly as recited in claim 11, wherein the first engagement member comprises at least one tooth extending into the slot.

13. The current sensing assembly as recited in claim 12, wherein the first engagement member comprises a rack of teeth extending along the inner surfaces of the arms, and the second engagement member comprises at least one tooth configured to engage the rack.

14. The current sensing assembly as recited in claim 1, wherein the retainer wall has a thickness less than approximately 0.5 inches.

15. A current sensing assembly configured to sense a current carrying member of a pad-mount distribution transformer, the current sensor assembly comprising:
a current sensor including a sensor body having a pair of opposing arms connected at a proximal end by a bridge, such that the arms and the bridge present respective inner surfaces that define a slot therebetween, wherein the sensor body carries an electrically conductive coil, and each of the inner surfaces presents a rack of teeth that project into the slot;
a retainer member including a retainer wall sized to fit within the open end of the slot so as to define a receptacle configured to retain the current carrying member, and a pair of arms at the other end, wherein the retainer wall defines a pair of channels each configured to receive one of the racks of teeth, and the arms each present at least one tooth configured to engage the racks of teeth, wherein the arms are flexible so as to bring the at least one tooth into and out of engagement with the racks of teeth.

16. The current sensing assembly as recited in claim 15, wherein the current sensor comprises a stop extending further into the slot than the teeth, and the retainer wall is configured to fit between the opposing racks of teeth and abut the stop so as to limit insertion of the retainer wall into the slot.

17. The current sensing assembly as recited in claim 15, wherein the retainer member further comprises a pad extending from the retainer wall.

18. A power measurement assembly for determining a power output of a pad mount distribution transformer that includes at least two terminal assemblies that each include current carrying members, the power measurement assembly comprising:
a current sensing assembly mounted onto a current carrying member of each of the terminal assemblies, each current sensing assembly comprising:
a current sensor including a current sensor body that defines a slot having an open end, the current sensor body carrying an electrically conductive coil, the slot being sized to receive at least one of the current carrying members therein such that the conductive coil produces an output indicating a sensed current level of the at least one current carrying member; and
a retainer member including a retainer wall sized to fit in the open end of the current sensor body so as to define a receptacle configured to retain the current carrying member; and
an electronic measuring device that receives at least one voltage signal indicating the sensed current levels of the terminal assemblies, further receives a line voltage of the terminal assemblies, and determines a power output of the transformer.

* * * * *